US011262812B2

(12) United States Patent
Chen et al.

(10) Patent No.: US 11,262,812 B2
(45) Date of Patent: Mar. 1, 2022

(54) ROTATABLE LOCKING MECHANISM FOR COMPUTER EXPANSION CARDS

(71) Applicant: Quanta Computer Inc., Taoyuan (TW)

(72) Inventors: Chao-Jung Chen, Taoyuan (TW); Kun-Pei Liu, Taoyuan (TW); Chih-Kai Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 133 days.

(21) Appl. No.: 16/858,057

(22) Filed: Apr. 24, 2020

(65) Prior Publication Data
US 2021/0333843 A1    Oct. 28, 2021

(51) Int. Cl.
*G06F 1/18*    (2006.01)
*H01R 12/70*   (2011.01)

(52) U.S. Cl.
CPC ......... *G06F 1/186* (2013.01); *H01R 12/7005* (2013.01)

(58) Field of Classification Search
CPC ..... G06F 1/185; G06F 1/186; H01R 12/7005; H01R 12/721; H01R 12/88; H05K 7/1405; H05K 7/1407; H05K 7/1408
See application file for complete search history.

(56) References Cited

U.S. PATENT DOCUMENTS

| 5,544,006 A * | 8/1996 | Radloff | G06F 1/184 |
| | | | 174/138 G |
| 9,564,712 B1 * | 2/2017 | Shih | G06F 1/185 |

\* cited by examiner

*Primary Examiner* — James Wu
(74) *Attorney, Agent, or Firm* — Nixon Peabody LLP

(57) ABSTRACT

A locking mechanism for securing different expansion cards in a slot of a chassis of a computing device is disclosed. The locking mechanism includes a base and a main body. The base is coupled to the chassis and movable between an open position and a closed position. The main body is coupled to the base and movable between a first orientation and a second orientation. When the base is in the closed position and the main body is in the first orientation, a first mating feature of the main body engages an expansion card having a first form factor inserted into the slot. When the base is in the closed position and the main body is in the second orientation, the second mating feature engages an expansion card having a second form factor inserted into the slot of the chassis.

20 Claims, 12 Drawing Sheets

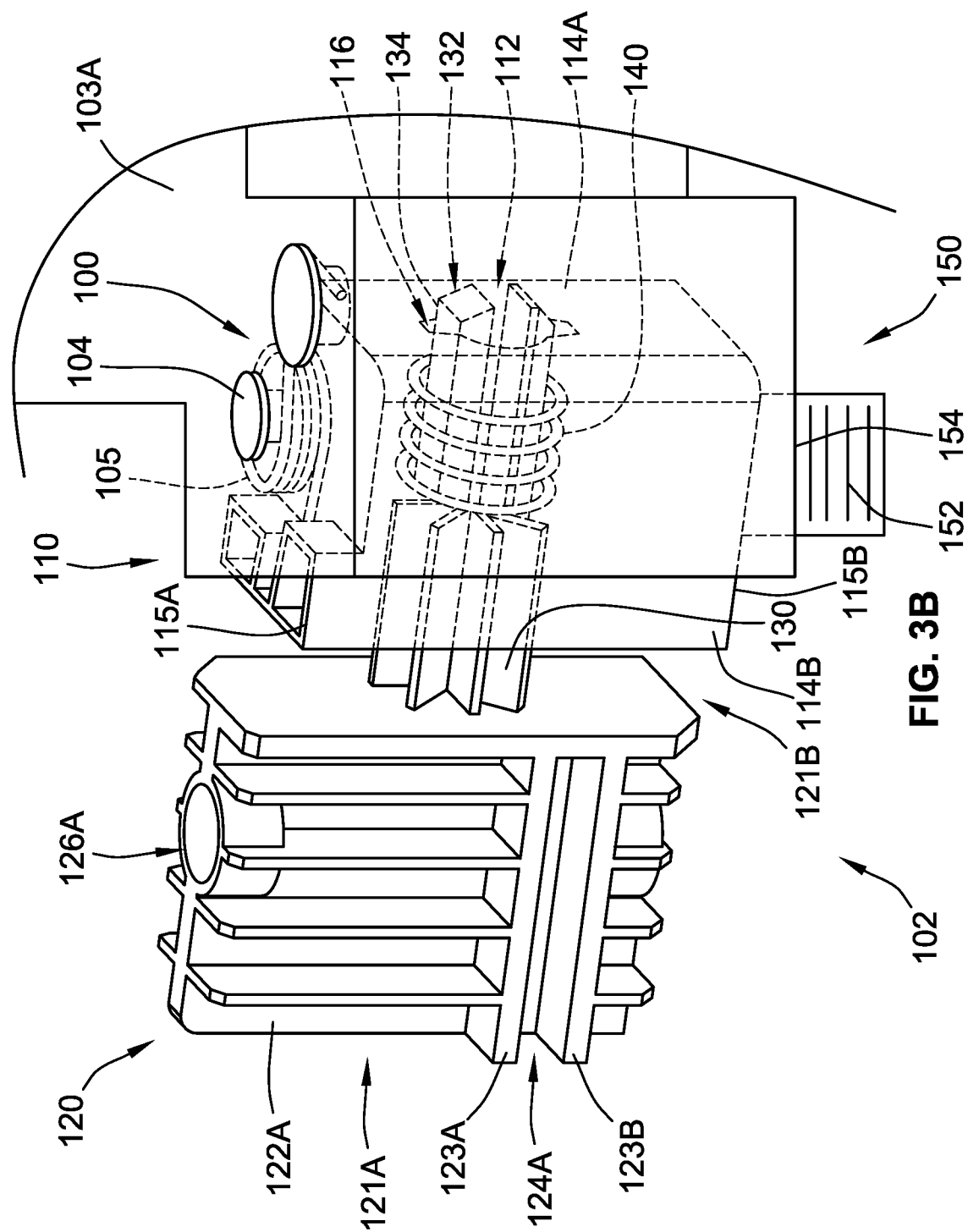

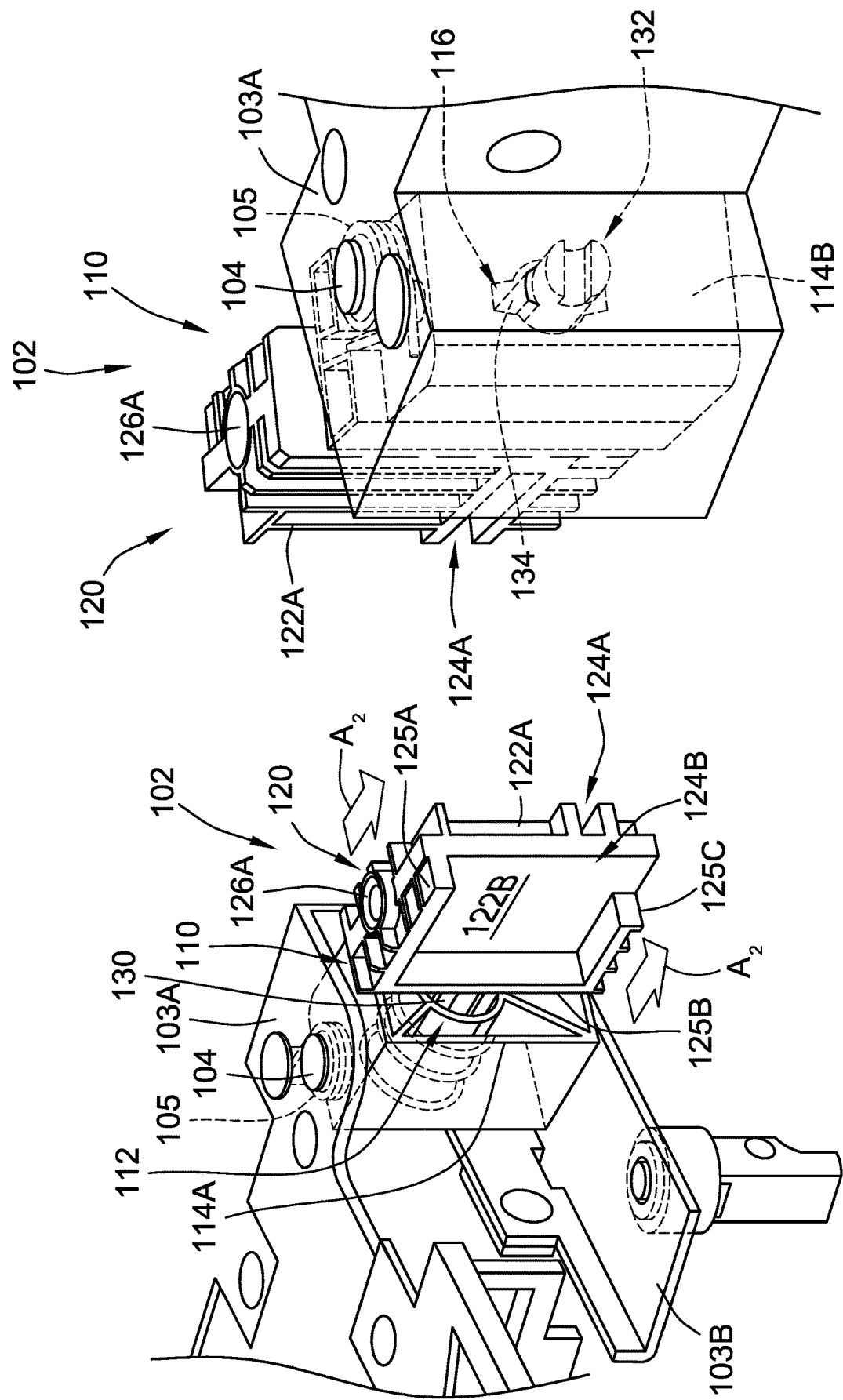

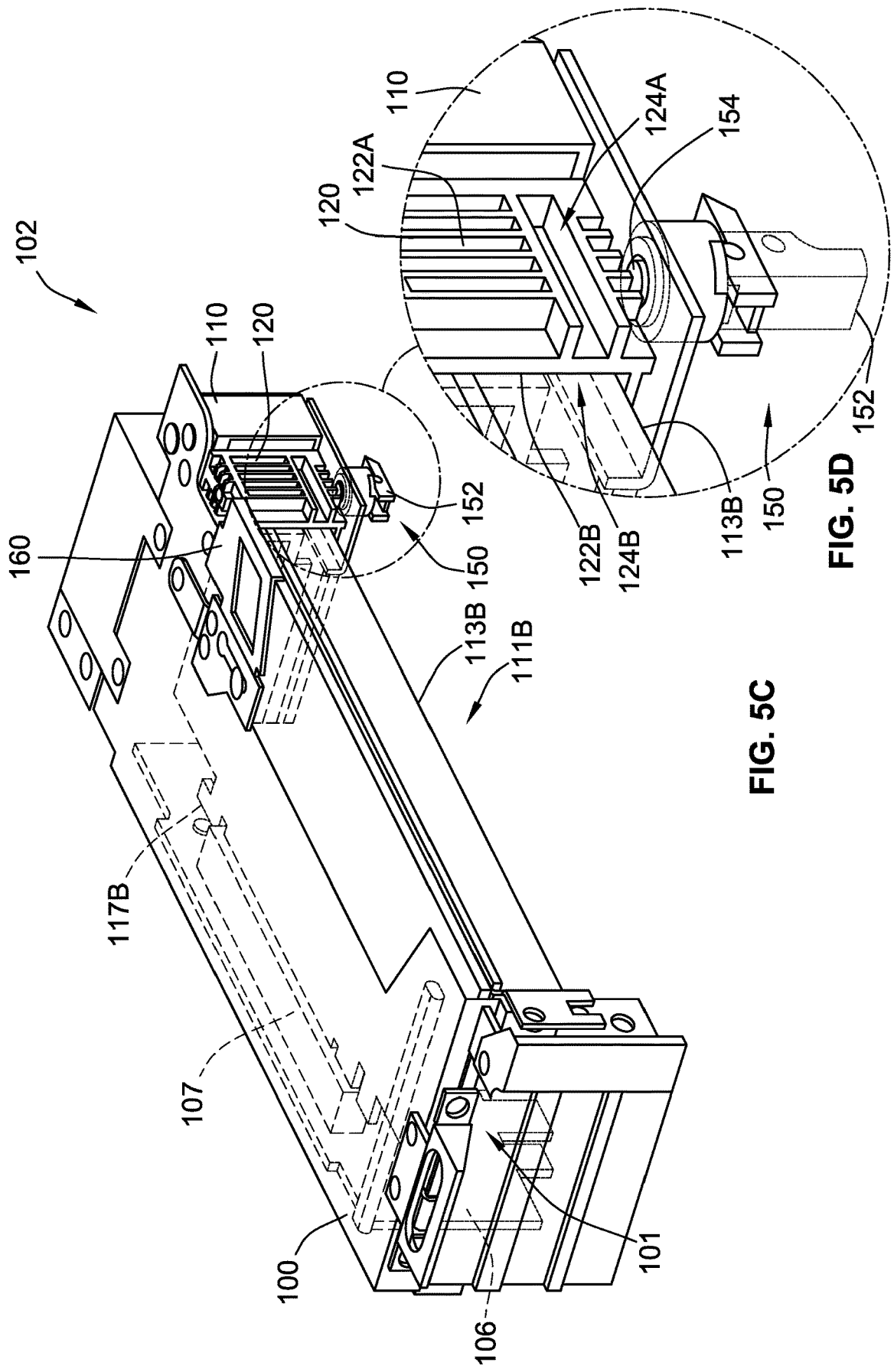

ROTATABLE LOCKING MECHANISM FOR COMPUTER EXPANSION CARDS

TECHNICAL FIELD

The present disclosure relates generally to systems and methods for securing expansion cards in a chassis of a computing device. More particularly, aspects of this disclosure relate to a rotatable locking mechanism with different orientations that is configured to secure different types of expansion cards in the chassis of a computing device.

BACKGROUND

Computing devices generally include a chassis (e.g., a housing) and a variety of different electronic components positioned inside the chassis. The chassis may also include a variety of slots into which expansion cards can be inserted. The expansion cards can connect to electronic components inside the chassis to offer new or improved features. FIG. 1 is a perspective view of an expansion card 14 inserted into a circuit board 12 of the chassis 10, illustrating a typical device used to secure the expansion card 14 in the chassis 10. The circuit board 12 includes a connector socket 16 that extends perpendicularly from the surface of the circuit board 12. The connector socket 16 includes various electrical connectors that mate with respective connectors on the expansion card 14. The expansion card 14 includes a hook feature 18 that is formed by a notch 20 in the expansion card 14. When the expansion card 14 is inserted into the connector socket 16, a latch device 22 is inserted into the notch 20, such that the hook feature 18 is secured between the latch device 22 and the circuit board 12/connector socket 16. However, this type of locking mechanism is generally not compatible with different size expansion cards, thus limiting the types of expansion cards that may be added to the computing device. Further, this mechanism requires that all expansion cards 14 have a hook feature 18 and a corresponding notch 20 in order to secure the expansion card 14 inside the chassis 10. Thus, there is a need for an improved locking mechanism for securing different types of expansion cards in the slot of the chassis.

SUMMARY

The various examples of the present disclosure are directed toward systems that include a locking mechanism for securing different expansion card form factors in a slot of a chassis of a computing device. In a first embodiment of the present disclosure, the locking mechanism comprises a base and a main body. The base is configured to be movably coupled to the chassis of the computing device, and is movable between an open position and a closed position. The main body is movably coupled to the base, and is movable between a first orientation and a second orientation. The main body has a first surface with a first mating feature, and a second surface with a second mating feature. When the base is in the closed position and the main body is in the first orientation, the first mating feature is configured to face toward and engage with a first expansion card having a first form factor inserted into the slot of the chassis, to thereby secure the first expansion card in the slot. When the base is in the closed position and the main body is in the second orientation, the second mating feature is configured to face toward and engage with a second expansion card having a second form factor inserted into the slot of the chassis, to thereby secure the second expansion card in the slot.

In some examples of the first embodiment, the main body is rotationally coupled to the base, and the first orientation of the main body and the second orientation of the main body are 180 degrees apart from each other.

In some examples of the first embodiment, the first mating feature is configured to face toward the slot of the chassis, and the second mating feature is configured to face away from the slot of the chassis, when the base is in the closed position and the main body is in the first orientation.

In some examples of the first embodiment, the second mating feature is configured to face toward the slot of the chassis, and the first mating feature is configured to face away from the slot of the chassis, when the base is in the closed position and the main body is in the second orientation.

In some examples of the first embodiment, the locking mechanism further comprises a projection portion extending away from the main body into a channel defined through the base, to thereby couple the main body to the base.

In some examples of the first embodiment, the projection portion is translationally and rotationally movable within the channel, such that the main body is translationally and rotationally coupled to the base.

In some examples of the first embodiment, the main body is translationally movable between a locked position and an unlocked position, and rotationally movable between the first orientation and the second orientation.

In some examples of the first embodiment, when the main body is in the locked position, the main body is rotationally locked and unable to rotate between the first orientation and the second orientation, In some examples of the first embodiment, when the main body is in the unlocked position, the main body is able to rotate between the first orientation and the second orientation.

In some examples of the first embodiment, the projection portion includes a rotation-locking feature, and the base includes a corresponding rotation-locking feature.

In some examples of the first embodiment, when the main body is in the locked position, the rotation-locking feature of the projection portion mates with the corresponding rotation-locking feature of the base, thereby preventing the main body from rotating between the first orientation and the second orientation.

In some examples of the first embodiment, when the main body is in the unlocked position, the rotation-locking feature of the projection portion does not mate with the corresponding rotation-locking feature of the base, thereby allowing the main body to rotate between the first orientation and the second orientation.

In some examples of the first embodiment, the rotation-locking feature of the base includes a groove defined through the base adjacent to the channel, and the rotation-locking feature of the projection portion includes a rib extending from a distal end of the projection portion.

In some examples of the first embodiment, when in the locked position, the distal end of the projection portion is positioned inside the channel such that the rib extends into the groove, thereby preventing the main body from rotating between the first orientation and the second orientation.

In some examples of the first embodiment, when in the unlocked position, the distal end of the projection portion extends out of the channel such that the rib does not extend into the groove, thereby allowing the main body to rotate between the first orientation and the second orientation.

In some examples of the first embodiment, the locking mechanism further comprises a spring mounted around the projection portion such that the spring is disposed between the main body and the base.

In some examples of the first embodiment, when the main body is moved to the unlocked position, the spring is compressed and exerts force on main body and base, thereby biasing the main body toward the locked position.

In some examples of the first embodiment, the first mating feature is a first groove defined in the first surface of the main body, and the second mating feature is a second groove defined in the second surface of the main body. The first mating feature is configured to engage with an edge of the first type of expansion card, and the second mating feature is configured to engage with an edge of a second type of expansion card.

In some examples of the first embodiment, the first groove has a first size, and the second groove has second size different from the first size. The first groove is configured to engage with the first type of expansion card and not the second type of expansion card. The second groove is configured to engage with the second type of expansion card and not the first type of expansion card.

In some examples of the first embodiment, the locking mechanism further comprises a plunger configured to be coupled to the chassis and to be movable between an extended state and a retracted state.

In some examples of the first embodiment, the base is biased toward the open position. The plunger locks the base in the closed position when plunger is in the extended state. The plunger allows the base to move back to the open position when the plunger is in the retracted state.

In some examples of the first embodiment, when the plunger is in the extended position, at least a portion of the plunger extends through the chassis and fits into a groove defined in the locking mechanism, to thereby lock the base in the closed position.

In a second embodiment of the present disclosure, a system includes a chassis of a computing device, a locking mechanism, and a plunger. The chassis houses one or more electronic components, and defines a slot sized to receive a first expansion card having a first form factor and a second expansion card having a second form factor different than the first form factor. The chassis also includes a first frame member and a second frame member. The locking mechanism is coupled to the chassis and is configured to secure the first expansion card and the second expansion card in the slot of the chassis. The locking mechanism includes a base and a main body. The base is rotationally coupled to the first frame member and the second frame member of the chassis, and is rotatable between an open position and a closed position. The main body is rotationally and translationally coupled to the base. The main body is translationally movable between a locked position and an unlocked position, the is rotatable between a first orientation and a second orientation when the main body is in the unlocked position. The main body has a first surface including a first mating feature, and a second surface including a second mating feature. The plunger is coupled to the first frame member of the chassis, and includes a plunger member that is configured to extend through the first frame member and engage a depression defined in the main body to lock the base in the closed position. When the base is in the closed position and the main body is in the first orientation, the first mating feature is configured to face toward and engage with the first expansion card having the first form factor inserted into the slot of the chassis to thereby secure the first expansion card having the first form factor in the slot. When the base is in the closed position and the main body is in the second orientation, the second mating feature is configured to face toward and engage with the second expansion card having the second form factor inserted into the slot of the chassis to thereby secure the second expansion card having the second form factor in the slot.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 3B is a perspective view of the locking mechanism of FIG. 2 in a first orientation, according to aspects of the present disclosure;

FIG. 3E is a perspective view of the locking mechanism of FIG. 2 moved to a locked position after rotating to the second orientation, according to aspects of the present disclosure;

FIG. 3F is a perspective view of the rotation-locking features of the locking mechanism of FIG. 3E when the locking mechanism is in the locked position, according to aspects of the present disclosure;

FIG. 5C is a perspective view of the example locking mechanism of FIG. 2 in the closed position while in the second orientation to thereby secure the second type of expansion card in the slot of the chassis, according to aspects of the present disclosure; and FIG. 5D is a close-up perspective view of a plunger securing the example locking mechanism of FIG. 2 in the closed position, according to aspects of the present disclosure;

Figure 1:
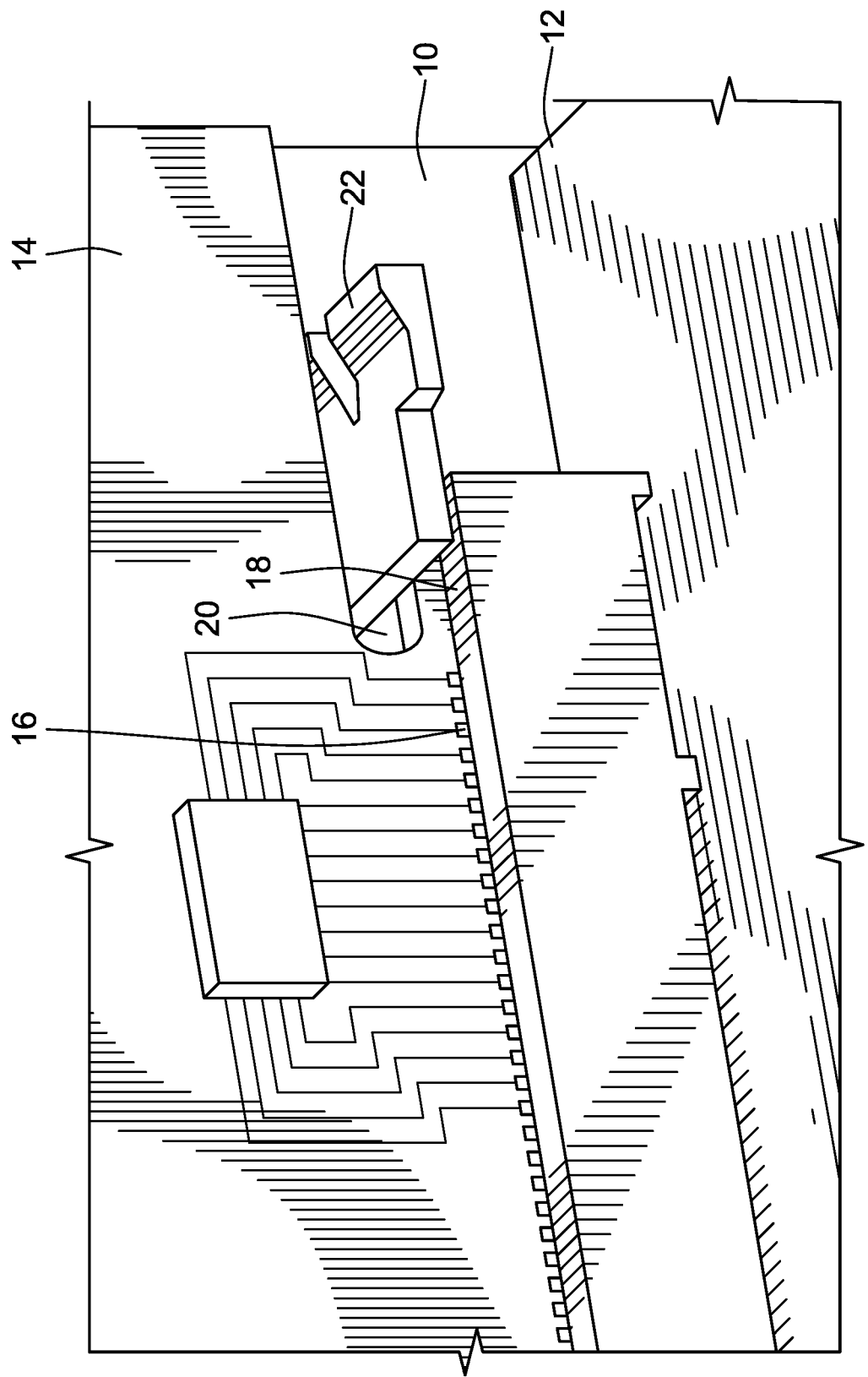
FIG. 1 is a perspective view of a conventional prior art latch device for securing an expansion card inside a slot of a chassis of a computing device.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 2:
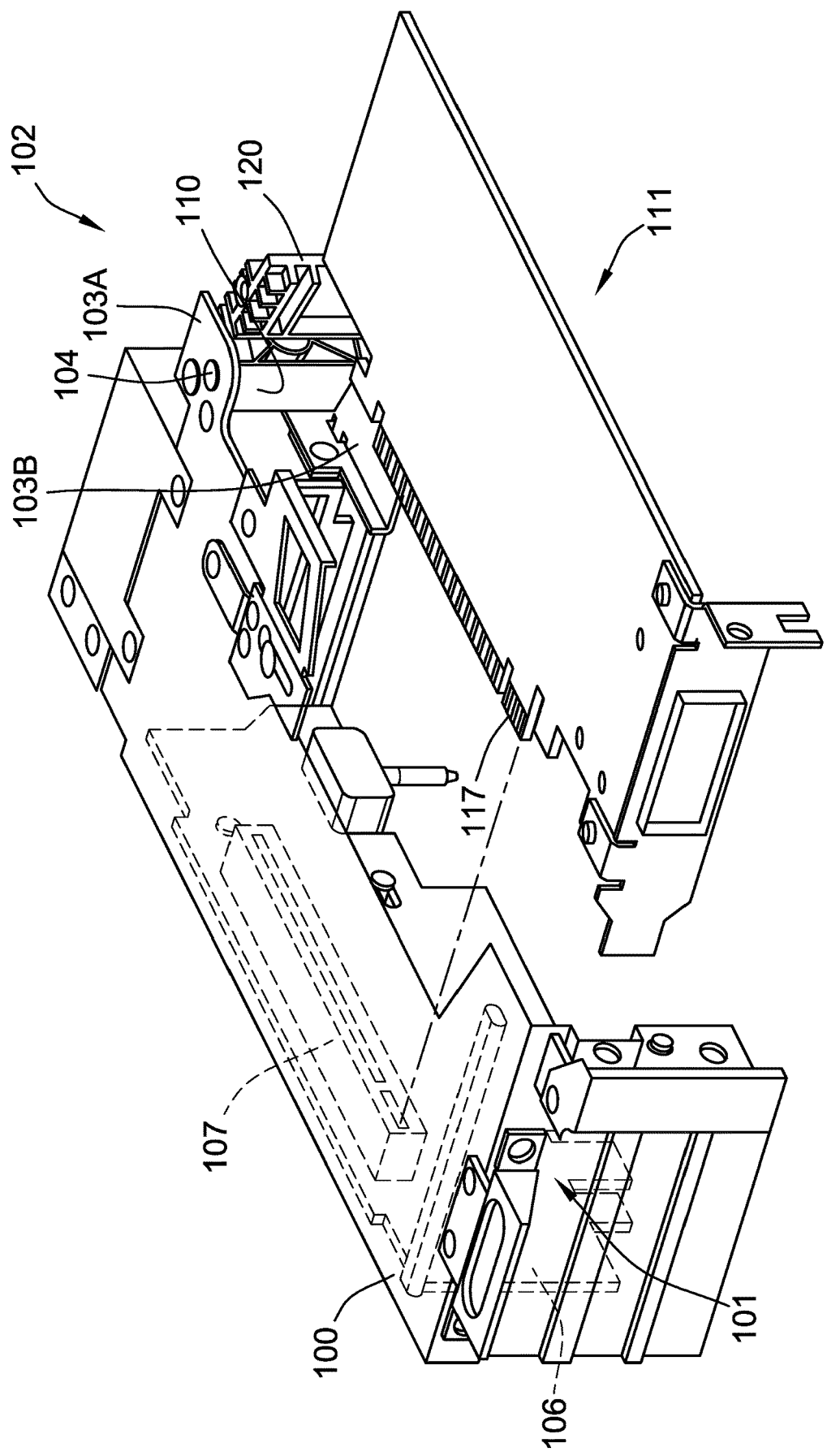
FIG. 2 is a perspective view of an expansion card being inserted into a slot of a chassis of a computing device and an example locking mechanism coupled to the chassis, according to aspects of the present disclosure.

FIG. 2 shows a perspective view of a portion of a chassis 100 of a computing device, and an expansion card 111 being inserted into a slot 101 of the chassis 100. The chassis 100 includes a circuit board 106 with a connector socket 107, into which a connector edge 117 of the expansion card 111 is inserted. The slot 101 is thus an opening defined by the chassis 100 and the circuit board 106. A locking mechanism 102 is coupled to the chassis 100 and is used to secure the expansion card 111 in the slot 101. The chassis 100 includes two frame members 103A and 103B which the locking mechanism 102 is coupled to.

The locking mechanism includes a base 110 and a main body 120. The base 110 is coupled to the frame members 103A and 103B via a fastener 104. In the implementation illustrated in FIG. 2, the fastener 104 is a pin that is inserted through the base 110 and the frame members 103A, 103B. The base 110 is thus able to rotate relative to the chassis 100 and the frame members 103A, 103B between an open position and a closed position. FIG. 2 shows the base 110 in the open position.

In some implementations, the base 110 is biased toward the open position. For example, a torsion spring 105 can be mounted between the base 110 and a head of the pin (which is the fastener 104 in this implementation). The torsion spring 105 also contacts the chassis 100. When the base 110 is rotated to the closed position, the torsion spring 105 is compressed, which biases the base 110 back to the open position.

Other types of fasteners can additionally or alternatively be used as the fastener 104, such as clips, pins, nails, screws, bolts, latches, etc. In these implementations, the base 110 can be rotationally or non-rotationally coupled to the chassis 100. In addition, the base 110 could be coupled to the chassis 100 using the fastener 104 in a non-rotational fashion, such that the base 110 cannot rotate relative to the chassis 100. In implementations where the base 110 is non-rotationally coupled to the chassis 100, the base 110 moves between the open and closed positions in a non-rotational manner. For example, the base 110 could move in a linear fashion so as to slide between the open position and the closed position.

Figure 3A:
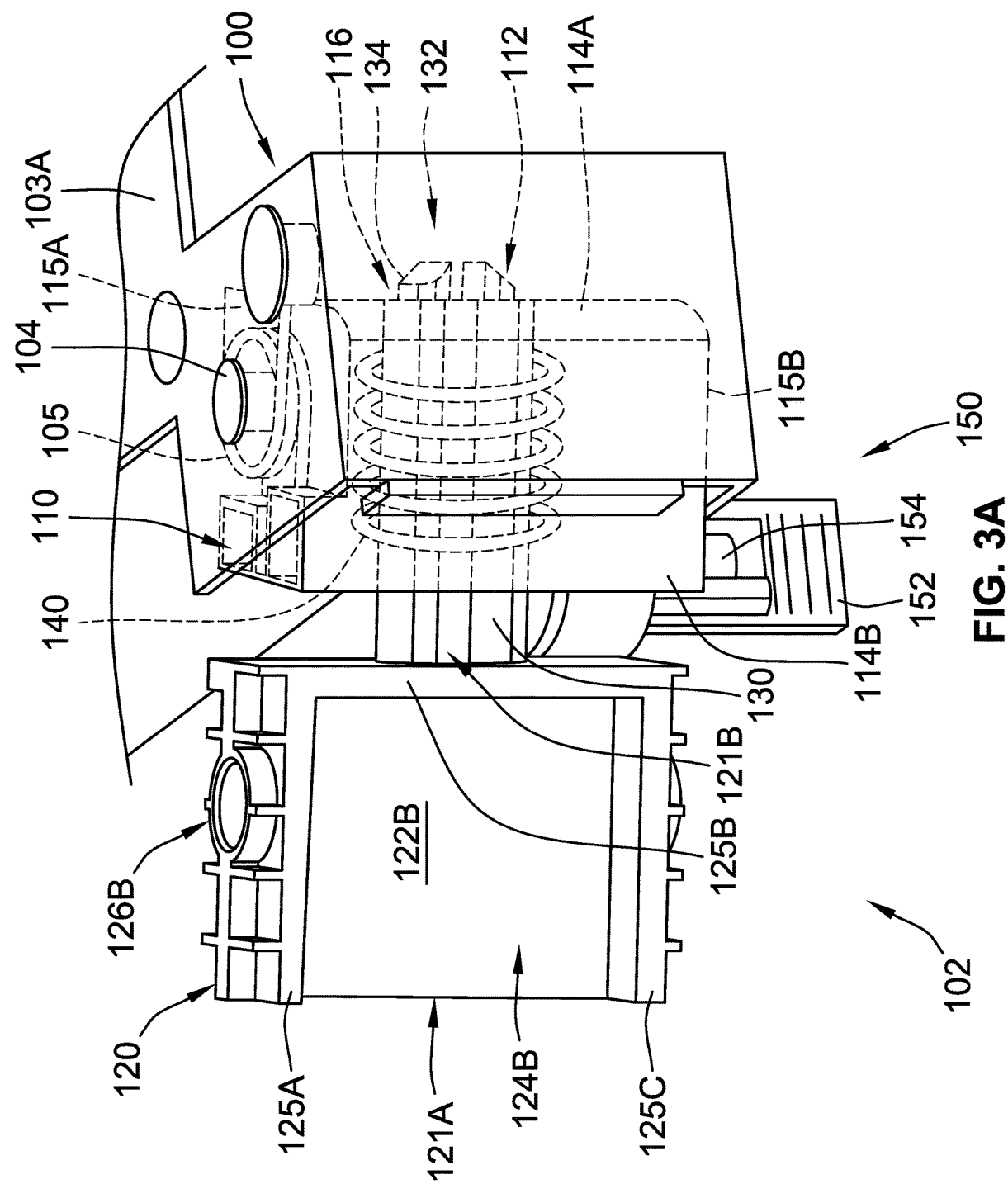
FIG. 3A is a perspective view of the locking mechanism of FIG. 2 in a first orientation, according to aspects of the present disclosure.

FIG. 3A shows a perspective view of the locking mechanism 102 in a first orientation. FIG. 3B shows a perspective view of the locking mechanism in a second orientation. The base 110 of the locking mechanism 102 has two opposing sides 114A and 114B, and upper and lower ends 115A and 115B. The fastener 104 is inserted through the base 110 via an opening defined between the upper and lower ends 115A and 115B. The fastener 104 is also inserted through frame members 103A, 103B of the chassis 100 such that the base 110 can rotate relative to the chassis 100. The base 110 also defines a channel 112 between the two opposing sides 114A and 114B (FIG. 3B). A projection portion 130 of the main body 120 is insertable into the channel 112.

The main body 120 of the locking mechanism 102 forms a first surface 122A (FIG. 3B) and an opposing second surface 122B (FIG. 3B). The first and second surfaces 122A and 122B are generally rectangular in the illustrated example, and are defined between a distal end 121A of the main body 120, and a proximal end 121B of the main body 120 that is proximate to the base 110. The first surface 122A includes a first mating feature 124A, while the second surface includes a second mating feature 124B. In the illustrated implementation, the first surface 122A and the second surface 122B are on opposite sides of the main body 120, e.g., are parallel to each other and face in opposite directions.

Figure 4A:
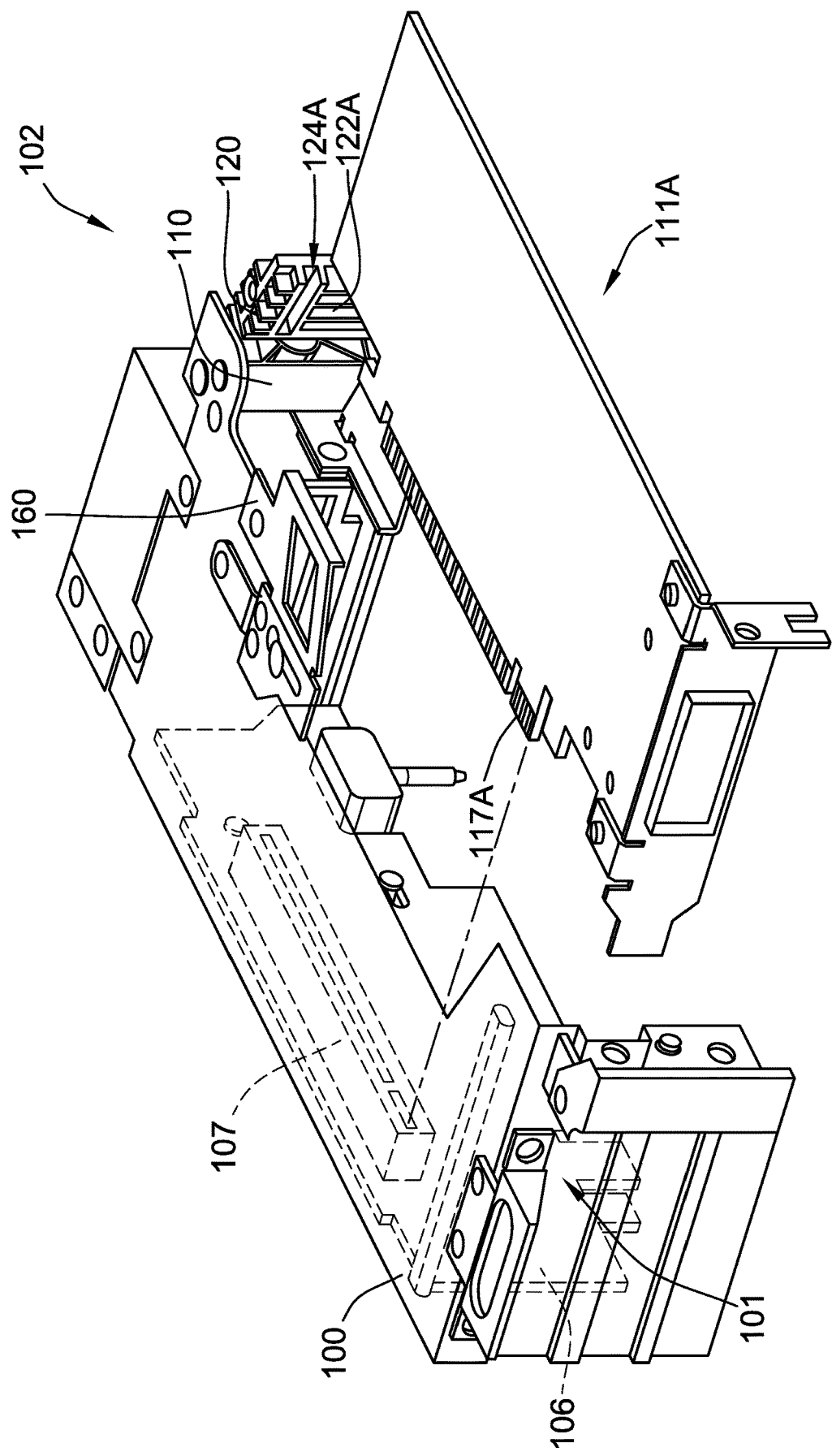
FIG. 4A is a perspective view of the example locking mechanism of FIG. 2 in an open position while a first type of expansion card is inserted into a slot of a chassis of a computing device, according to aspects of the present disclosure.
Figure 4B:
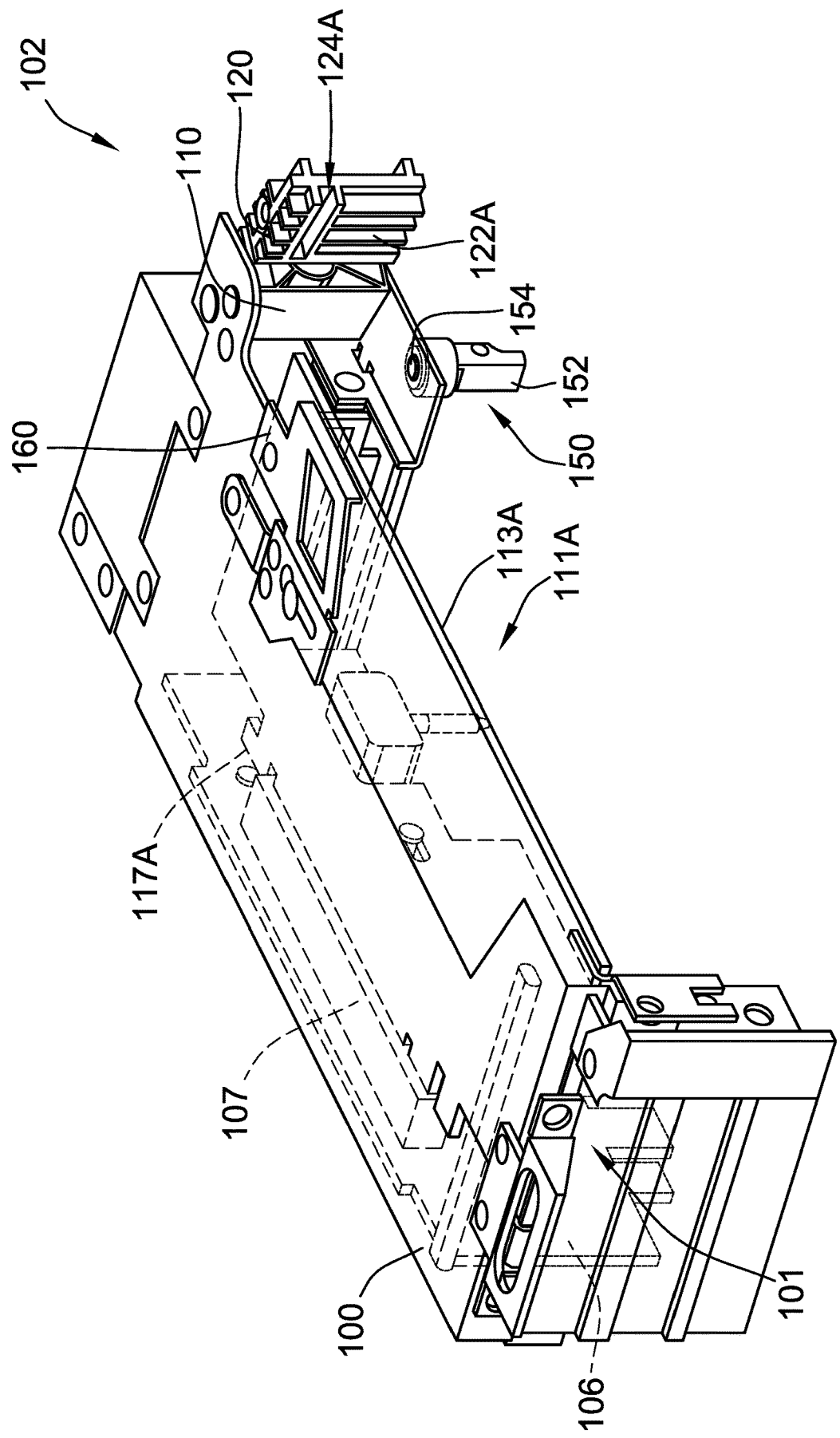
FIG. 4B is a perspective view of the example locking mechanism of FIG. 2 moving from the open position to a closed position while in the first orientation, according to aspects of the present disclosure.
Figures 4C, 4D:
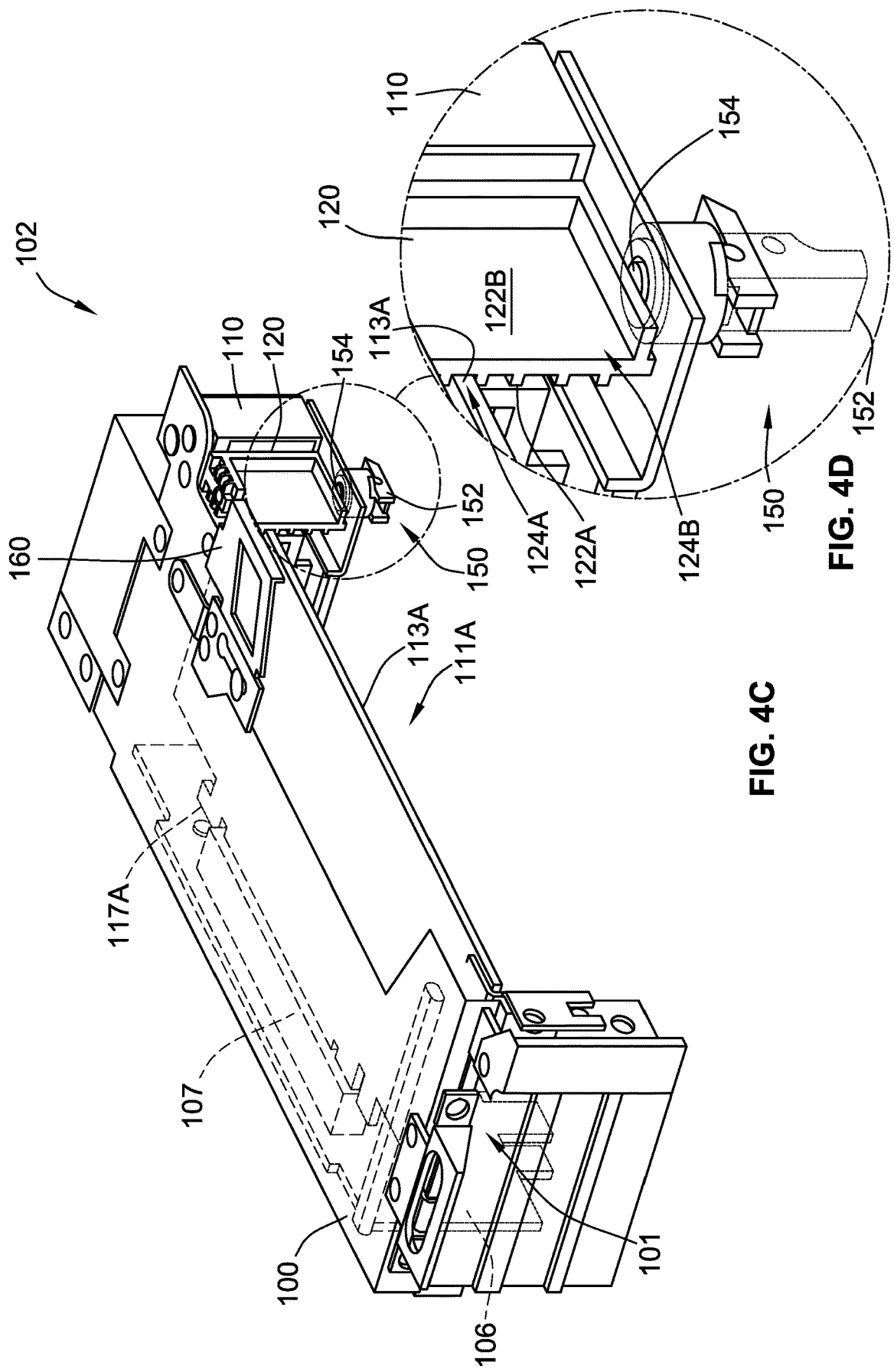
FIG. 4C is a perspective view of the example locking mechanism of FIG. 2 in the closed position while in the first orientation to thereby secure the first type of expansion card in the slot of the chassis, according to aspects of the present disclosure.
FIG. 4D is a close-up perspective view of a plunger securing the example locking mechanism of FIG. 2 in the closed position, according to aspects of the present disclosure.

The first mating feature 124A (FIG. 3B) is configured to engage with a first expansion card having a first form factor, to aid in securing the first expansion card in the slot 101 of the chassis 100 (FIG. 4C). The second mating feature 124B (FIG. 3A) is configured to engage with a second expansion card having a second form factor, to aid in securing the second expansion card in the slot 101 of the chassis 100 (FIG. 5C). Generally, the first mating feature 124A is configured so that it only engages with the first type of expansion card, while the second mating feature 124B is configured so that it only engages with the second type of expansion card.

As shown in FIGS. 3A and 3B, the first mating feature 124A is a groove formed on the first surface 122A that extends between the distal end 121A and the proximal end 121B of the main body 120. The groove is defined between two extension members 123A and 123B that extend outward from the first surface 122A between the distal end 121A and the proximal end 121B. The groove forming the first mating feature 124A is sized such that the edge of the first type of expansion card fits into the groove forming first mating feature 124A, while the edges of other types of expansion cards (such as the second type of expansion card) do not fit into the groove forming first mating feature 124A.

As shown in FIG. 3A, the second mating feature 124B is formed by edge protrusions 125A, 125B, 125C along three edges of the second surface 122B. Thus, the second mating feature 124B is generally the open space formed on the second surface 122B between the edge protrusions 125A, 125B, 125C. The open space on the second surface 122B forming the second mating feature 124B is sized such that the edge of the second type of expansion card fits into the open space forming the second mating feature 124B, while the edges of other types of expansion cards (such as the first type of expansion card) do not fit into the open space forming second mating feature 124B.

In other implementations, either of the first and second mating features 124A, 124B can be grooves such as the groove forming the first mating feature 124A in FIG. 3B. Similarly, either of the first and second mating features 124A, 124B can be open spaces, such as the open space forming the second mating feature 124B in FIG. 3A. Other types of mating features could also be used, such as clamps, clips, etc. When the main body 120 is in the first orientation (FIG. 3A), the first surface 122A and the first mating feature 124A face toward the chassis 100. When the main body 120 is in the second orientation (FIG. 3B), the second surface 122B and the second mating feature 124B face toward the chassis 100.

The locking mechanism 102 also includes a plunger 150 that can lock or secure the base 110 in the closed position. The plunger 150 includes a plunger switch 152 and a plunger member 154, and is movable between an extended state and a retracted state. In the retracted state (shown in FIGS. 3C and 3E), the plunger 150 allows the base 110 to move between the open position and the closed position. When the plunger 150 is moved into the extended state via actuation of the plunger switch 152, the plunger member 154 extends through frame member 103B of the chassis 100 (FIG. 2) and contacts the locking mechanism 102.

In the implementation illustrated in FIGS. 3A and 3B, the main body 120 also includes a first depression 126A and a second depression 126B, located on opposite sides of the main body 120 from each other. When the main body 120 is in the first orientation (shown in FIG. 3A), the first depression 126A is aligned with the plunger member 152, which can be extended to fit into the first depression 126A to lock the base 110 in the closed position while the main body 120 is in the first orientation. Similarly, when the main body 120 is in the second orientation (shown in FIG. 3B), the second depression 126B is aligned with the plunger member 152, which can be extended to fit into the second depression 126B to lock the base 110 in the closed position while the main body 120 is in the second orientation. The plunger 150 thus aids in retaining the first and second types of expansion cards in the slot 101 defined by the chassis 100.

In some implementations, the plunger 150 can also prevent the base 110 from moving fully to the closed position. If the plunger 150 is moved to the extended state prior to the base 110 moving fully to the closed position, the plunger member 154 can contact the first surface 122A or the second surface 122B (depending on the orientation of the main body 120) and prohibit further movement of the base 110 toward the closed position. Thus, the plunger 150 generally needs to be in the retracted state to allow the base 110 to move to the closed position. Once the base 110 has moved to the closed position and the first depression 126A or the second depression 126B are aligned with the plunger member 154, the plunger 150 can be moved to the extended state so that the plunger member 154 extends into the first depression 126A or the second depression 126B.

The projection portion of the main body 120 is configured to rotate relative to the base 110 to move the locking mechanism 102 between the first orientation and the second orientation. The projection portion 130 extends away from the proximal end 121B of the main body 120 into the channel 112 defined through the base 110. A distal end 132 of the projection portion 130 generally extends out of the channel 112. The channel 112 and the projection portion 130 generally have corresponding shapes, and can have circular cross-sections (e.g., are generally cylindrical), oval cross-sections, square cross-sections, rectangular cross-sections, etc. The periphery of the channel 112 forms a cylindrical interior surface within the base 110. The projection portion 130 thus couples the main body 120 to the base 110.

Generally, the projection portion 130 is translationally movable within the channel 112 along its axis, e.g., can be inserted into and removed from the channel 112. The projection portion 130 extends through a spring 140, which is also positioned in the channel 112. The main body 120 is thus translationally coupled to the base 110. The projection portion 130 is also rotationally movable within the channel 112, e.g., can be rotated about its axis. The main body 120 is thus also rotationally coupled to the base 110. As can be seen in FIGS. 3A and 3B, the first orientation and the second orientation are generally 180 degrees apart from each other, e.g., the main body 120 rotates 180 degrees to transition between the first orientation and the second orientation. In other implementations, the main body 120 can undergo different types of movement between the first orientation and the second orientation.

In other implementations, the first surface 122A and second surface 122B could have a different positional relationship. For example, the first surface 122A and the second surface 122B could face perpendicular to each other. In these implementations, the main body 120 would rotate about 90 degrees to move between the first orientation and the second orientation. In still other implementations, the first mating feature 124A and the second mating feature 124B could be positioned on the same single surface of the main body 120. In these implementations, the base 110 and/or the main body 120 could move in a linear fashion between the first orientation (where the first mating feature 124A engages an expansion card 111) and the second orientation (where the second mating feature 124B engages an expansion card 111).

The main body 120 can also move between a locked position and an unlocked position to rotationally lock the main body 120 into either the first orientation or the second orientation. When the main body 120 is in the locked position, the main body 120 is not able to rotate between the first orientation and the second orientation. When the main body 120 is in the unlocked position, the main body 120 is able to rotate between the first orientation and the second orientation.

Both the base 110 and the projection portion 130 include corresponding rotation-locking features that mate with each other when the main body 120 is in the locked position, to prevent the main body 120 from rotating between the first orientation and the second orientation. Similarly, when the main body 120 is in the unlocked position, the rotation-locking features of the base 110 and the projection portion 130 do not mate with each other, thus allowing the main body 120 to rotate between the first orientation and the second orientation.

In the implementation illustrated in FIGS. 3A and 3B, the rotation-locking features of the base 110 include one or more grooves 116 defined through the base 110 between the two opposing sides 114A and 114B. The grooves 116 are generally defined adjacent to the channel 112, such that the channel 112 and the grooves 116 form a continuous open space through the base 110. The rotation-locking features of the projection portion 130 include one or more ribs 134 that extend outwardly from the distal end 132 of the projection portion 130. The combined cross-section of the projection portion 130 and the one or more ribs 134 generally matches the combined cross-section of the channel 112 and the one or more grooves 116. The one or more ribs 134 are thus configured to fit into the one or more grooves 116. Generally, the channel 112 will have grooves 116 defined on opposite sides of the channel 112, such that the ribs 134 can fit into either of the grooves 116, depending on whether the main body 120 is in the first orientation or the second orientation.

When the main body 120 is in the locked position, the one or more ribs 134 are positioned within the one or more grooves 116, which prevents the main body 120 from rotating between the first orientation and the second orientation. When the main body 120 is in the unlocked position, the one or more ribs 134 are positioned outside the one or more grooves 116, which allows the main body 120 to rotate between the first orientation and the second orientation.

Figure 3D:
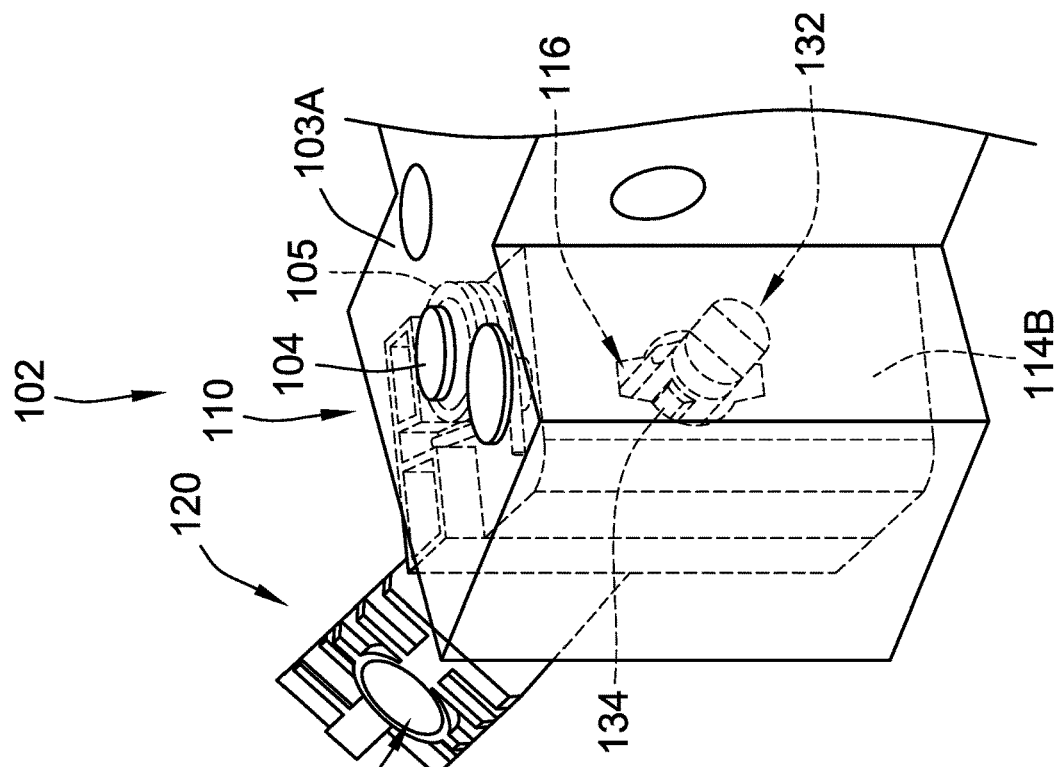
FIG. 3D is a perspective view of rotation-locking features of the locking mechanism of FIG. 3C when the locking mechanism is in the unlocked position, according to aspects of the present disclosure.
Figure 3C:
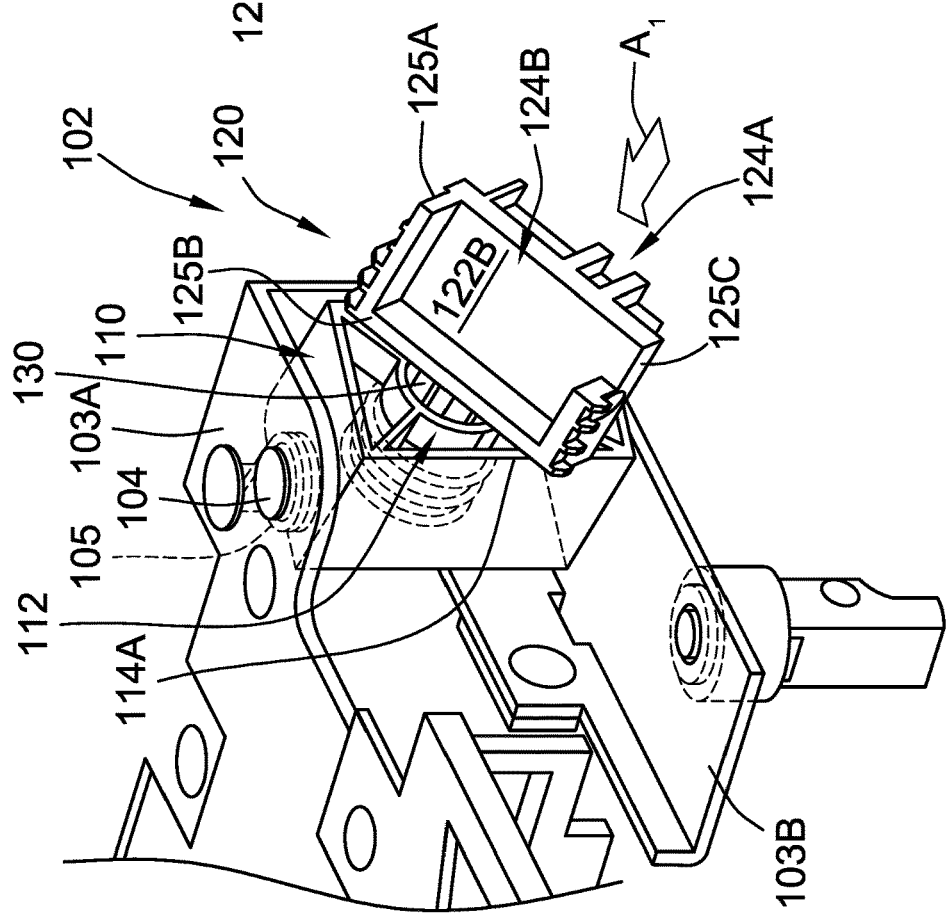
FIG. 3C is a perspective view of the locking mechanism of FIG. 2 moved to an unlocked position and rotating toward a second orientation, according to aspects of the present disclosure.

FIGS. 3C-3F show move the main body 120 is moved between the between the first orientation and the second orientation. In FIGS. 3C and 3D, the main body 120 has moved to the unlocked position, and has begun to rotate relative to the base 110. As shown, the main body 120 is moved toward side 114B of the base 110, as shown by arrow $A_1$. This causes the distal end 132 of the projection portion to extend away from side 114A of the base 110, such that the ribs 134 are no longer position in the grooves 116, as shown in FIG. 3D. Movement of the main body 120 towards the base 110 compresses the spring 140. When the base 110 is rotated, the ribs 134 do not aligned with the grooves 116, so that the force of the spring 140 does not cause the main body 120 to automatically move back to locked position.

In FIGS. 3E and 3F, the main body 120 has fully rotated toward the second orientation. As shown in FIG. 3F, the ribs 134 of the projection portion 130 are now aligned with the grooves 116. The main body 120 can thus move away from side 114B of the base 110, as shown by arrows $A_2$, back to the unlocked position. Generally, the spring 140 exerts a force on the base 110 and the main body 120, which causes the main body 120 to automatically move away from the base 110 back into the locked position once the main body 120 is full rotated to the second orientation. In this manner, the main body 120 is biased toward the locked position (e.g., the main body 120 is biased away from the base 110). In other implementations, spring 140 is not used, so that the main body 120 must be manually moved from the unlocked position to the locked position.

FIGS. 4A-4D show an expansion card 111A with a first form factor being inserted into the slot 101 of the chassis 100, and being secured by the locking mechanism 102. The circuit board 106 with the connector socket 107 is positioned inside the chassis 100. The expansion card 111A has a connector edge 117A that is inserted into the connector socket 107 when the expansion card 111A is inserted into the slot 101 of the chassis 100.

In FIG. 4A, the main body 120 of the locking mechanism 102 is in the first orientation. In the first orientation, the first surface 122A and the first mating feature 124A generally face toward the slot 101. The second surface 122B and the second mating feature 124B (FIGS. 4C and 4D) generally face away from the slot 101. However, the base 110 is in the open position, which allows the expansion card 111A to be inserted into the slot 101.

In FIG. 4B, the expansion card 111A has been fully inserted into the slot 101, and the connector edge 117A is fully inserted into the connector socket 107. The base 110 is shown moving from the open position to the closed position. As the base 110 moves toward the expansion card 111A, the first surface 122A and the first mating feature 124A move toward an edge 113A of the expansion card 111A. The first mating feature 124A is generally aligned with the edge 113A of the expansion card 111A. The plunger switch 152 is in a first position such that the plunger member 154 does not extend through the chassis 100. The plunger 150 is thus in the retracted state, which allows the base 110 to continue to move to the closed position.

In FIGS. 4C and 4D, the base 110 has been moved to the closed position, and the plunger 150 is in the extended state. The first surface 122A faces the expansion card 111A, such that the groove forming the first mating feature 124A engages the edge 113A of the expansion card 111A. The plunger switch 152 has moved to a second position, which causes the plunger member 154 to extend through the chassis 100 into the first depression 126A (FIGS. 3B and 3C) of the main body 120. FIG. 4D shows a close-up view of the edge 113A of the expansion card 111A, and the main body 120. The edge 113A of the expansion card 111A is sized to fit into the first mating feature 124A of the main body 120, and there is little to no room for any vertical movement of the edge 113A (e.g., movement perpendicular relative to the flat plane of the expansion card 111A). Thus, when the main body 120 is in the first orientation and the base 110 is in the closed position (as shown in FIGS. 4C and 4D), the first surface 122A and the first mating feature 124A face toward the slot 101 in the chassis 100, and the locking mechanism 102 can be used to secure the first type of expansion card in the slot 101 of the chassis 100. The expansion card is held between the slot 101 of the chassis 100 and the first surface 122A of the locking mechanism 102. FIG. 4D also shows the first position of the plunger switch 152 (dashed outline) and the second position of the plunger switch 152 (solid outline). Movement of the plunger switch 152 to the second position extends the plunger member 154 and causes the plunger member 154 to engage the first depression 126A (FIGS. 3B and 3C).

FIGS. 4A-4C also show a latch 160 that can be slidably coupled to the chassis 100. In FIGS. 4A and 4B, the latch is in a retracted position. In FIG. 4C, the latch 160 is in an expanded position. After the base 110 moves to the closed position to secure the expansion card 111B in the slot 101, the latch 160 can be moved to the expanded position to further secure the base 110 in the closed position. A portion of the latch 160 extends downward and overhangs the second surface 122B of the main body 120 of the locking mechanism. This overhanging portion of the latch 160 will contact the main body 120 if a user attempts to move the base 110 back to the open position before the latch 160 is retracted. Thus, the latch 160 prevents the base 110 from inadvertently moving back to the open position, when the locking mechanism 102 is in the first orientation.

FIGS. 5A-5D show an expansion card 111B with a second form factor being inserted into the slot 101 of the chassis 100, and being secured by the locking mechanism 102. The circuit board 106 with the connector socket 107 is positioned inside the chassis 100. The expansion card 111B has a connector edge 117B that is inserted into the connector socket 107 when the expansion card 111B is inserted into the slot 101 of the chassis 100.

Figure 5A:
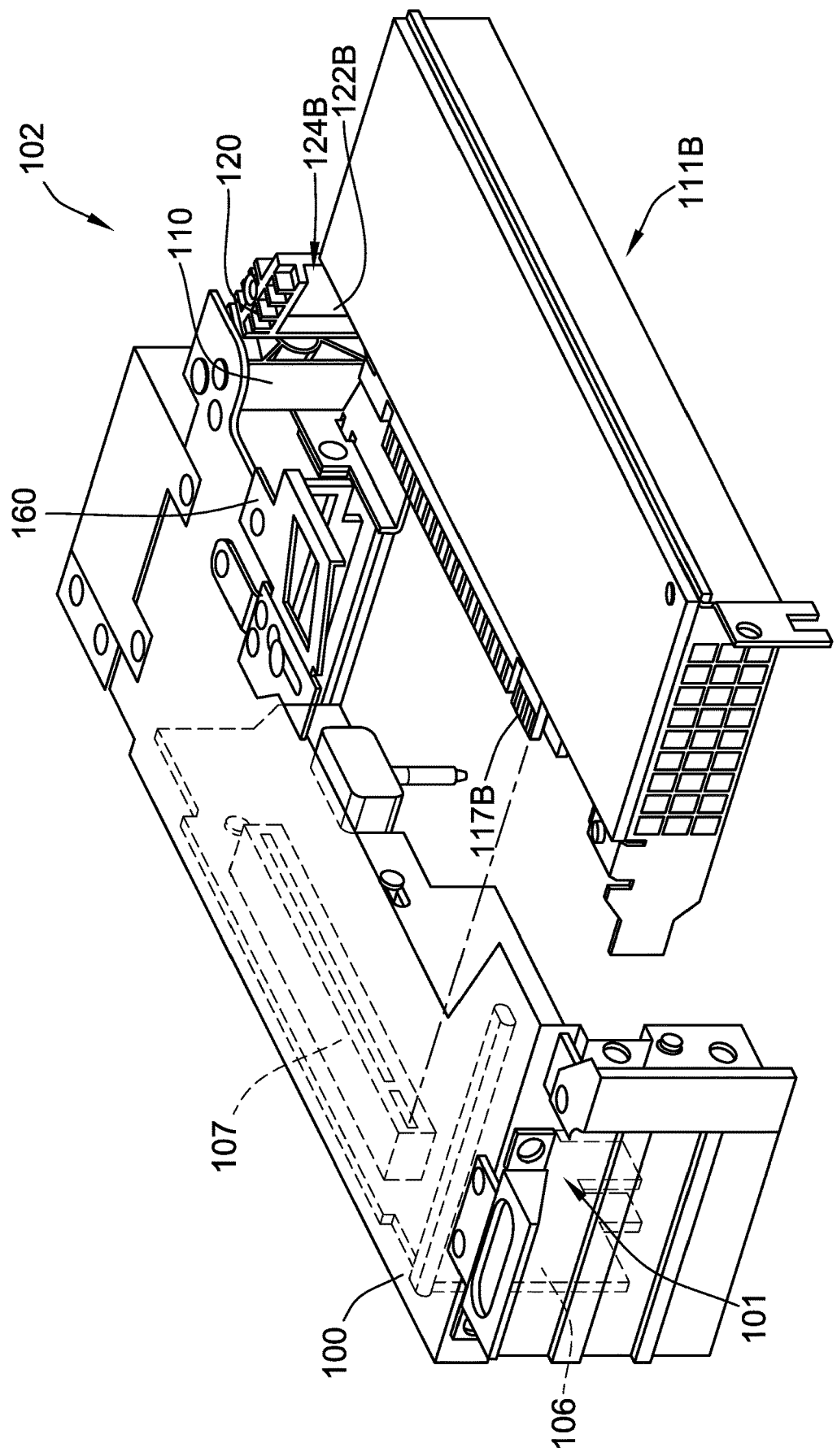
FIG. 5A is a perspective view of the example locking mechanism of FIG. 2 in the open position while a second type of expansion card is inserted into the slot of the chassis, according to aspects of the present disclosure.

In FIG. 5A, the main body 120 of the locking mechanism 102 is in the second orientation. In the second orientation, the second surface 122B and the second mating feature 124B generally face toward the slot 101. The first surface 122A and the first mating feature 124A (FIGS. 5C and 5D) generally face away from the slot 101. However, the base 110 is in the open position, which allows the expansion card 111B to be inserted into the slot 101.

Figure 5B:
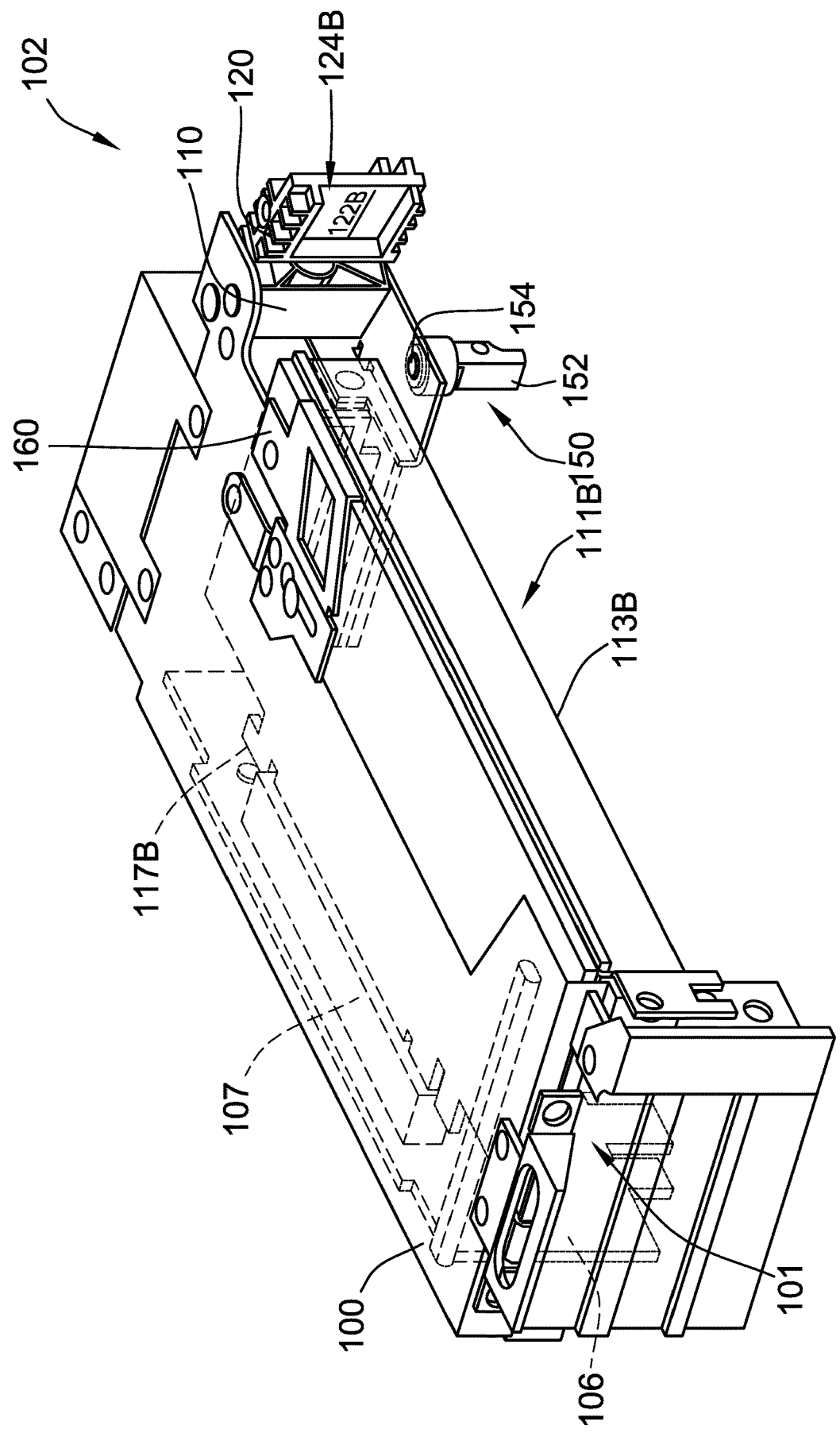
FIG. 5B is a perspective view of the example locking mechanism of FIG. 2 moving from the open position to the closed position while in the second orientation, according to aspects of the present disclosure.

In FIG. 5B, the expansion card 111B has been fully inserted into the slot 101, and the connector edge 117B is fully inserted into the connector socket 107. The base 110 is shown moving from the open position to the closed position by arrow $A_4$. As the base 110 moves toward the expansion card 111B, the second surface 122B and the second mating feature 124B move toward an edge 113B of the expansion card 111B. The second mating feature 124B is generally aligned with the edge 113B of the expansion card 111B. The plunger switch 152 is in the first position such that the plunger member 154 does not extend through the chassis 100. The plunger 150 is thus in the retracted state, which allows the base 110 to continue to move to the closed position.

In FIGS. 5C and 5D, the base 110 has moved to the closed position, and the plunger 150 is in the extended state. The second surface 122B faces the expansion card 111B, such that the open space forming the second mating feature 124B engages edge 113B of the expansion card 111B. The plunger switch 152 has moved to the second position, which causes the plunger member 154 to extend through the chassis 100 into the second depression 126B (FIG. 3A) of the main body 120. FIG. 5D shows a close-up view of the edge 113B of the expansion card 111B, and the main body 120. The edge 113B of the expansion card 111B is sized to fit into the second mating feature 124B of the main body 120, and there is little to no room for any vertical movement of the edge 113B (e.g., movement perpendicular relative to the flat plane of the expansion card 111B). Thus, when the main body 120 is in the second orientation and the base 110 is in the closed position (as shown in FIGS. 5C and 5D), the second surface 122B and the second mating feature 124B face toward the slot 101 in the chassis 100, and the locking mechanism 102 can be used to secure the second type of expansion card in the slot 101 of the chassis 100. The expansion card is held between the slot 101 of the chassis 100 and the second surface 122A of the locking mechanism 102. FIG. 5D also shows the first position of the plunger switch 152 (dashed outline) and the second position of the plunger switch 152 (solid outline). Movement of the plunger switch 152 to the second position extends the plunger member 154 and causes the plunger member 154 to engage the second depression 126B (FIG. 3A).

FIGS. 5A-5C also show the latch 160 that can be slidably coupled to the chassis 100. When used with the locking mechanism 102 in the second orientation, the overhanging portion of the latch 160 extends downward and overhangs the first surface 122A of the main body 120 of the locking mechanism 102. Thus, the latch 160 will also prevents the base 110 from inadvertently moving back to the open position, when the locking mechanism 102 is in the second orientation.

As can be seen in FIGS. 4D and 5D, the first and second mating features 124A, 124B are sized to engage the respective edges 113A, 113B of the expansion card 111A, 11B having two different form factors, respectively. If the main body 120 is in the second orientation when the expansion card 111A having the first form factor is inserted into the slot 101, the second mating feature 124B cannot engage the edge 113A of the expansion card 111A. The edge 113A is smaller than the second mating feature 124A of the main body 120, and thus the expansion card 111A is able to move relative to the chassis 100 and the locking mechanism 102, even though the base 110 is in the closed position. Similarly, if the main body 120 is in the first orientation when the expansion card 111B having the second form factor is inserted into the slot 101, the first mating feature 124A cannot engage the edge 113B of expansion card 111B. The edge 113B is larger than the first mating feature 124A of the main body 120, and thus the expansion card 111A is able to move relative to the chassis 100 and the locking mechanism 102. Moreover, contact between the edge 113B and the first mating feature 124A can prevent the base 110 from fully reaching the closed position.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A locking mechanism for securing different expansion card form factors in a slot of a chassis of a computing device, the locking mechanism comprising:

a base configured to be movably coupled to the chassis of the computing device, the base being movable between an open position and a closed position; and a main body movably coupled to the base and movable between a first orientation and a second orientation, the main body having a first surface and a second surface, the first surface including a first mating feature, the second surface including a second mating feature, wherein when the base is in the closed position and the main body is in the first orientation, the first mating feature is configured to face toward and engage with a first expansion card having a first form factor inserted into the slot of the chassis to thereby secure the first expansion card in the slot; and wherein when the base is in the closed position and the main body is in the second orientation, the second mating feature is configured to face toward and engage with a second expansion card having a second form factor inserted into the slot of the chassis to thereby secure the second expansion card in the slot.

2. The locking mechanism of claim 1, wherein the main body is rotationally coupled to the base, and wherein the first orientation of the main body and the second orientation of the main body are 180 degrees apart from each other.

3. The locking mechanism of claim 1, wherein when the base is in the closed position and the main body is in the first orientation, the first mating feature is configured to face toward the slot of the chassis and the second mating feature is configured to face away from the slot of the chassis.

4. The locking mechanism of claim 3, wherein when the base is in the closed position and the main body is in the second orientation, the second mating feature is configured to face toward the slot of the chassis and the first mating feature is configured to face away from the slot of the chassis.

5. The locking mechanism of claim 1, further comprising a projection portion extending away from the main body into a channel defined through the base, to thereby couple the main body to the base.

6. The locking mechanism of claim 5, wherein the projection portion is translationally and rotationally movable within the channel, such that the main body is translationally and rotationally coupled to the base.

7. The locking mechanism of claim 6, wherein the main body is translationally movable between a locked position and an unlocked position, and rotationally movable between the first orientation and the second orientation.

8. The locking mechanism of claim 7, wherein when the main body is in the locked position, the main body is rotationally locked and unable to rotate between the first orientation and the second orientation, and wherein when the main body is in the unlocked position, the main body is able to rotate between the first orientation and the second orientation.

9. The locking mechanism of claim 8, wherein the projection portion includes a rotation-locking feature, and wherein the base includes a corresponding rotation-locking feature.

10. The locking mechanism of claim 9, wherein when the main body is in the locked position, the rotation-locking feature of the projection portion mates with the corresponding rotation-locking feature of the base, thereby preventing the main body from rotating between the first orientation and the second orientation.

11. The locking mechanism of claim 10, wherein when the main body is in the unlocked position, the rotation-locking feature of the projection portion does not mate with the corresponding rotation-locking feature of the base, thereby allowing the main body to rotate between the first orientation and the second orientation.

12. The locking mechanism of claim 11, wherein the rotation-locking feature of the base includes a groove defined through the base adjacent to the channel, and wherein the rotation-locking feature of the projection portion includes a rib extending from a distal end of the projection on portion.

13. The locking mechanism of claim 12, wherein when in the locked position, the distal end of the projection portion is positioned inside the channel such that the rib extends into the groove, thereby preventing the main body from rotating between the first orientation and the second orientation, and wherein when in the unlocked position, the distal end of the projection portion extends out of the channel such that the rib does not extend into the groove, thereby allowing the main body to rotate between the first orientation and the second orientation.

14. The locking mechanism of claim 1, further comprising a spring mounted around the projection portion such that the spring is disposed between main body and base, and wherein when the main body is moved to the unlocked position, the spring is compressed and exerts force on main body and base, thereby biasing the main body toward the locked position.

15. The locking mechanism of claim 1, wherein the first mating feature is a first groove defined in the first surface of the main body and the second mating feature is a second groove defined in the second surface of the main body, the first mating feature being configured to engage with an edge of the first expansion card, the second mating feature being configured to engage with an edge of the second expansion card.

16. The locking mechanism of claim 15, wherein the first groove has a first size, and wherein the second groove has a second size different from the first size, such that the first groove is configured to engage with the first expansion card and not the second expansion card, and such that second groove is configured to engage with the second expansion card and not the first expansion card.

17. The locking mechanism of claim 1, further comprising a plunger configured to be coupled to the chassis and to be movable between an extended state and a retracted state.

18. The locking mechanism of claim 17, wherein the base is biased toward the open position, wherein the plunger locks the base in the closed position when plunger is in the extended state, and wherein the plunger allows the base to move back to the open position when the plunger is in the retracted state.

19. The locking mechanism of claim 18, wherein when the plunger is in the extended position, at least a portion of the plunger extends through the chassis and fits into a groove defined in the locking mechanism, to thereby lock the base in the closed position.

20. A system comprising:
a chassis of a computing device housing one or more electronic components, the chassis defining a slot sized to receive a first expansion card having a first form factor and a second expansion card having a second form factor different than the first form factor, the chassis include a first frame member and a second frame member;
a locking mechanism coupled to the chassis and configured to secure the first expansion card and the second expansion card in the slot of the chassis, the locking mechanism including:

a base rotationally coupled to the first frame member and the second frame member of the chassis, the base being rotatable between an open position and a closed position; and a main body rotationally and translationally coupled to the base, the main body being translationally movable between a locked position and an unlocked position, the main body being rotatable between a first orientation and a second orientation when the main body is in the unlocked position, the main body having a first surface including a first mating feature, and a second surface including a second mating feature; and a plunger coupled to the first frame member of the chassis, the plunger including a plunger member configured to extend through the frame member and engage a depression defined in the main body to lock the base in the closed position, wherein when the base is in the closed position and the main body is in the first orientation, the first mating feature is configured to face toward and engage with the first expansion card having the first form factor inserted into the slot of the chassis to thereby secure the first expansion card having the first form factor in the slot; and wherein when the base is in the closed position and the main body is in the second orientation, the second mating feature is configured to face toward and engage with the second expansion card having the second form factor inserted into the slot of the chassis to thereby secure the second expansion card having the second form factor in the slot.

* * * * *